United States Patent
Lai et al.

(10) Patent No.: US 12,349,440 B2
(45) Date of Patent: Jul. 1, 2025

(54) SEAL RING PATTERNS

(71) Applicant: Taiwan Semiconductor Manufacturing Company, Ltd., Hsinchu (TW)

(72) Inventors: Yen Lian Lai, Hsinchu (TW); Chun Yu Chen, Hsinchu (TW); Yung Feng Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 447 days.

(21) Appl. No.: 17/827,409

(22) Filed: May 27, 2022

(65) Prior Publication Data

US 2023/0040287 A1 Feb. 9, 2023

Related U.S. Application Data

(60) Provisional application No. 63/229,894, filed on Aug. 5, 2021.

(51) Int. Cl.
| | |
|---|---|
| *H01L 23/31* | (2006.01) |
| *H10D 30/62* | (2025.01) |
| *H10D 30/67* | (2025.01) |
| *H10D 64/23* | (2025.01) |

(Continued)

(52) U.S. Cl.
CPC ....... *H10D 64/512* (2025.01); *H01L 23/3142* (2013.01); *H10D 30/6219* (2025.01); *H10D 30/6735* (2025.01); *H10D 64/257* (2025.01); *H10D 84/40* (2025.01)

(58) Field of Classification Search
CPC . H01L 23/562; H01L 23/585; H01L 29/0673; H01L 29/42392; H01L 29/66439; G06F 30/392; G06F 30/398
See application file for complete search history.

(56) References Cited

U.S. PATENT DOCUMENTS

| | | | |
|---|---|---|---|
| 7,323,710 B2 * | 1/2008 | Kim ................... | H01L 29/78687 257/19 |
| 7,671,469 B2 * | 3/2010 | Lee ................... | H01L 29/66636 257/213 |

(Continued)

FOREIGN PATENT DOCUMENTS

TW 201336021 A 9/2013

*Primary Examiner* — Eric A. Ward
(74) *Attorney, Agent, or Firm* — HAYNES AND BOONE, LLP

(57) ABSTRACT

Integrated circuit (IC) chips are provided. An IC chip according to the present corner area between an outer corner of the device region and an inner corner of the ring region. The ring region includes a first active region extending along a first direction, a first source/drain contact disposed partially over the first active region and extending along the first direction, and first gate structures disposed completely over the first active region and each extending lengthwise along the first direction. The corner area includes a second active region extending along a second direction that forms an acute angle with the first direction, a second source/drain contact disposed partially over the second active region and extending along the second direction, and second gate structures disposed over the second active region and each extending along the first direction.

20 Claims, 8 Drawing Sheets

(51) Int. Cl.
*H10D 64/27* (2025.01)
*H10D 84/40* (2025.01)

(56) References Cited

U.S. PATENT DOCUMENTS

| | | | |
|---|---|---|---|
| 7,910,956 B2* | 3/2011 | Hosomi | H01L 27/0203 |
| | | | 257/203 |
| 8,237,201 B2* | 8/2012 | Chuang | H01L 27/0207 |
| | | | 257/E27.108 |
| 10,304,781 B2* | 5/2019 | Baek | H01L 22/34 |
| 10,727,218 B2 | 7/2020 | Wu et al. | |
| 2015/0021713 A1* | 1/2015 | Cheng | H01L 21/76877 |
| | | | 257/487 |
| 2021/0265286 A1* | 8/2021 | Lei | G06F 30/392 |

\* cited by examiner

SEAL RING PATTERNS

PRIORITY DATA

This application claims priority to U.S. Provisional Patent Application Ser. No. 63/229,894, filed Aug. 5, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line)) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

Due to the scaling down, the structures of the FinFETs or MBC transistors may be susceptible to damages due to mist ingress or stress during singulation. Seal structures have been implemented to protect semiconductor devices. While existing seal structures are generally satisfactory for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
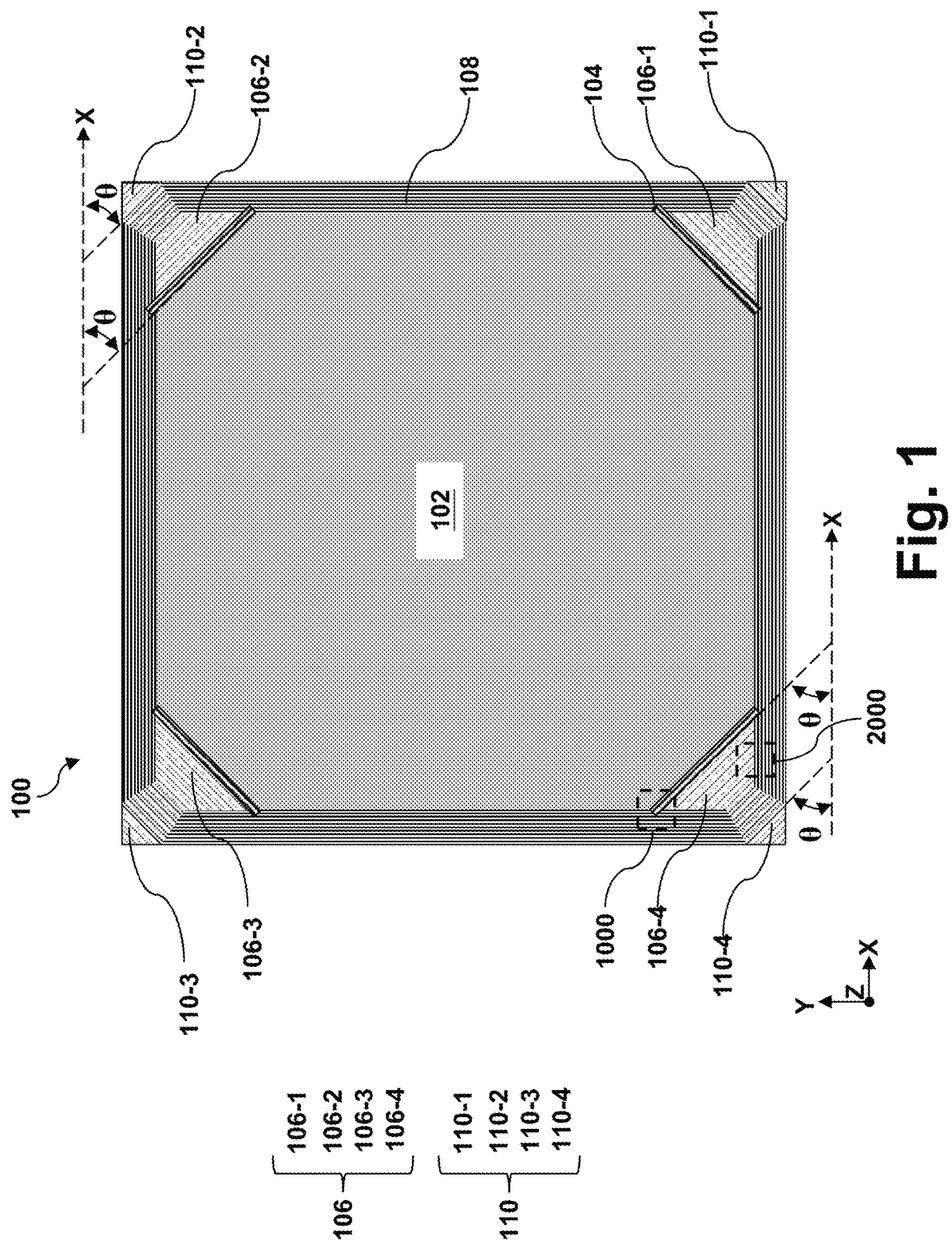
FIG. 1 illustrates a top view of an integrated circuit (IC) chip, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed. For avoidance of doubts, the X, Y and Z directions in figures of the present disclosure are perpendicular to one another. Throughout the present disclosure, like reference numerals denote like features, unless otherwise excepted.

Seal structures are used to prevent semiconductor devices in an integrated circuit (IC) chip from being damaged due to mist ingress or stress during singulation of the IC chip. Multi-gate devices, such as FinFETs and MBC transistors, emerge as the industry moves toward smaller device nodes. While FinFETs and MBC transistors feature improved gate control and reduced short channel effects, they are not immune from damages from water and stress. In fact, due to their delicate dimensions and structures, they and their interconnect structures may be more prone to damages without adequate seal structures. Seal structures and semiconductor structures that they protect are generally formed using the same processes. For example, when it comes to multi-gate devices, gate-last or replacement gate processes may be adopted to form both structures in the device region and seal rings. In a gate-last process, a dummy gate stack is formed as a placeholder to undergo various processes and is later replaced with a functional gate structure. In some existing technologies, because the dummy gate stacks in the seal ring region cover a majority of the area of the underlying active region, the removal of the dummy gate stacks may result in substantial loss of the active region. While the active region in the seal ring region may not serve any electrical function, the substantial loss of active region may cause anomalies in the seal ring structure, thereby weakening the same.

The present disclosure provides embodiments of an IC chip that includes seal structures. According to embodiments of the present disclosure, the IC chip includes a device region, a ring region surrounding the device region, and an inner corner area disposed between an outer corner of the device region and an inner corner of the ring region. The ring region includes a first active region extending along a first direction and a plurality of first gate structures disposed completely over the first active region. The plurality of first gate structures are spaced apart from one another and aligned along the first direction. The inner corner area includes a second active region extending along a second direction that form an acute angle with the first direction. The inner corner area further includes a plurality of second gate structures disposed completely over the second active region. The plurality of second gate structures are spaced apart from one another and arranged along the second direction. Because the plurality of first gate structures and the second gate structures do not cover a large and continuous area of the respective active regions, their formation is less likely to result in substantial loss of active regions or anomalies in the seal ring structures.

Reference is first made to FIG. 1, which includes a top view of a substrate 100. The substrate 100 includes a device region 102, a ring region 108 continuously surrounding the device region 102, four inner corner areas 106 disposed between outer corners of the device region 102 and inner corners of the ring region 108, four outer corner areas 110 around outer corners of the ring region 108. The inner corner areas 106 include a first inner corner area 106-1, a second inner corner area 106-2, a third inner corner area 106-3, and a fourth inner corner area 106-4. For ease of reference, the first inner corner area 106-1, the second inner corner area 106-2, the third inner corner area 106-3, and the fourth inner corner area 106-4 may be collectively or respectively referred to as inner corner areas 106. The outer corner areas 110 include a first outer corner area 110-1, a second outer corner area 110-2, a third outer corner area 110-3, and a fourth outer corner area 110-4. For ease of reference, the first outer corner area 110-1, the second outer corner area 110-2, the third outer corner area 110-3, and the fourth outer corner area 110-4 may be collectively or respectively referred to as outer corner areas 110. In some embodiments represented in FIG. 1, each of the inner corner areas 106 includes an overlapping region 104 that may extend partially into the ring region 108.

The substrate 100, the device region 102, and the ring region 108 may be substantially rectangular when viewed along the Z direction from the top. Each of the inner corner areas 106 resembles an isosceles right triangle with the right-angle corner clipped off. Each of the outer corner areas 110 has a shape of a right isosceles triangle. In other words, as shown in FIG. 1, the hypotenuse of each of the inner corner areas 106 or each of the outer corner areas 110 forms an acute angle $\theta$ with the X direction or the Y direction. The acute angle $\theta$ may be between about 40° or about 50°. In the depicted embodiment, the acute angle $\theta$ is at 45°. In FIG. 1, the device region 102 includes four cut-off corners that includes an edge parallel to the hypotenuse of the adjacent inner corner area 106. The ring region 108, while being largely rectangular in shape, is disposed between and engages the inner corner areas 106 and the device region 102. That is, the ring region 108 includes cut-off outer corners that correspond to the outer corner areas 110 and push-out inner corners that correspond to the four inner corner areas 106. As shown in FIG. 1, the ring region 108 generally extend continuously around the device region 102. In the depicted embodiments, a portion of the ring region 108 may be interrupted by the overlapping regions 104 of the inner corner areas 106. Experiments show that this overlapping arrangement provides better protection to the device region 102. Further details of the overlapping regions 104 will be provided below.

In some embodiments, the substrate 100 may be a bulk silicon (Si) substrate. Alternatively, substrate 100 may include elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, the substrate 100 includes one or more group III-V materials, one or more group II-VI materials, or combinations thereof. In still some instances, the substrate 100 is a semiconductor-on-insulator substrate, such as a silicon-on-insulator (SOI) substrate, a silicon germanium-on-insulator (SGOI) substrate, or a germanium-on-insulator (GeOI) substrate. In still some embodiments, the substrate 100 may be diamond substrate or a sapphire substrate.

Different regions of the substrate 100 may include various semiconductor structures, such as active regions, gate structures disposed over channel regions of the active regions, source/drain features disposed over source/drain regions of the active regions, source/drain contacts disposed over source/drain features, and gate contact vias disposed over the gate structures. The active regions may include silicon (Si), germanium (Ge), silicon germanium (SiGe). In some embodiments, the active regions may include a plurality of first semiconductor layers interleaved by a plurality of second semiconductor layers. The first semiconductor layers may be silicon (Si) layers and the second semiconductor layers may be silicon germanium (SiGe) layers. In the device region 102, the silicon layers may become channel layers or channel members that may be released when the silicon germanium layers are selectively removed. In this sense, the silicon layers may be referred to as channel layers and the silicon germanium layers may be referred to as sacrificial layers. In the ring region 108 or the inner corner areas 106, the silicon germanium layers may not be selectively removed because the silicon germanium layers are not exposed when the dummy gate stacks are removed. For that reason, when the active regions include a stack of silicon layers interleaved by silicon germanium layers, the final structure in the ring region 108 may include active regions where the silicon germanium layers are still present.

The gate structures include a gate dielectric layer and a gate electrode layer over the gate dielectric layer. In some embodiments, the gate dielectric layer includes an interfacial layer and a high-k gate dielectric layer. High-k dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-k gate dielectric layer may include hafnium oxide. Alternatively, the high-k gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The high-k gate dielectric layer may be formed by ALD, physical vapor deposition (PVD), CVD, oxidation, and/or other suitable methods.

The gate electrode layer may include a single layer or alternatively a multi-layer structure, such as various combinations of a metal layer with a selected work function to enhance the device performance (work function metal layer), an oxygen blocking layer, a capping layer, a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), molybdenum (Mo), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed using ALD, PVD, CVD, e-beam evaporation, or other suitable process.

Source/drain features may include silicon (Si) doped with an n-type dopant, such as phosphorus (P) or arsenic (As) or silicon germanium (SiGe) doped with a p-type dopant, such as boron (B) or boron difluoride ($BF_2$). The source/drain contacts may include a barrier layer, a silicide layer, and a metal fill layer disposed over the silicide layer. The barrier layer may include titanium nitride or tantalum nitride and functions to prevent electro-migration of the metal fill layer. The silicide layer may include titanium silicide, tantalum silicide, cobalt silicide, nickel silicide, or tungsten silicide. The silicide layer is disposed at the interface between the metal fill layer and the source/drain features to reduce contact resistance. The metal fill layer may include ruthenium (Ru), copper (Cu), nickel (Ni), cobalt (Co), or tungsten (W).

Figure 2:
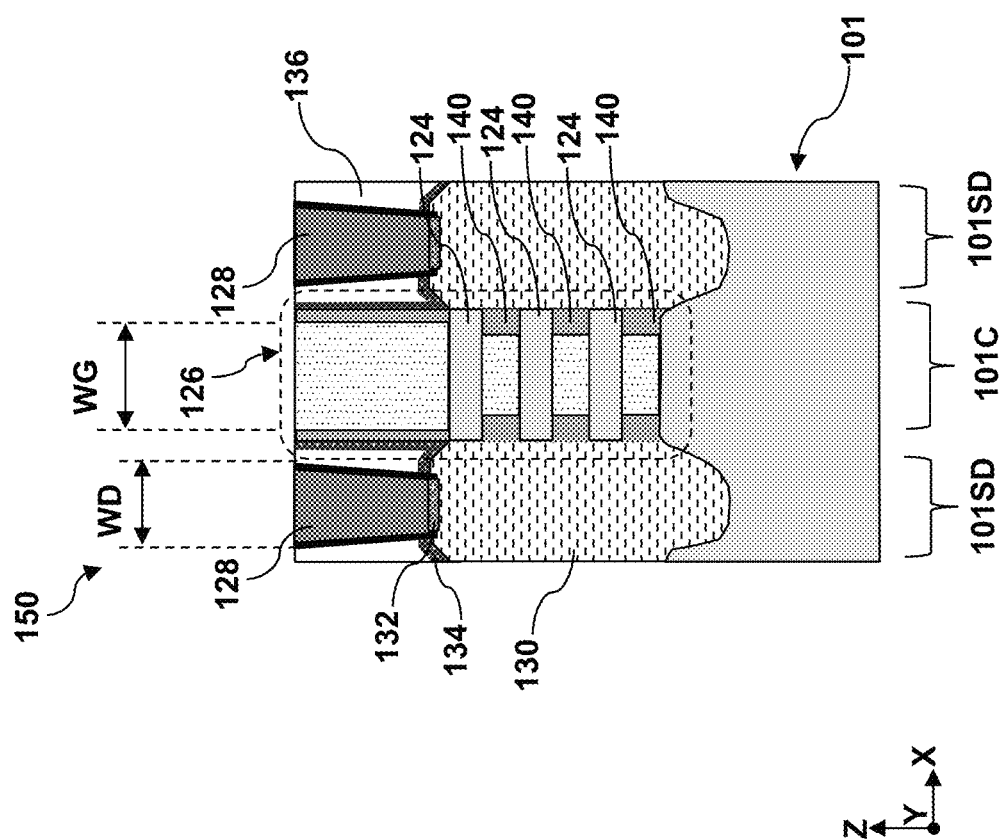
FIG. 2 illustrates a cross-sectional view of a semiconductor structure in a device region of the IC chip in FIG. 1, according to one or more aspects of the present disclosure.

The device region 102 may include logic devices, memory devices, and input/output (I/O) devices. The logic devices may include, for example, inverters, AND gates, OR gates, NAND gates, NOR gates, XNOR gates, XOR gates, and NOT gates. The memory devices may include static random access memory (SRAM) devices. The logic devices, memory devices, or I/O devices may include a plurality multi-gate transistors, such as FinFETs or MBC transistors. FIG. 2 illustrates a fragmentary cross-sectional view of an MBC transistor 150 that may be found in the device region 102. The MBC transistor 150 includes a first active region 101 disposed in the device region 102. The first active region 101 includes a channel region 101C disposed between two source/drain regions 101SD. The first active region 101 includes a vertical stack of channel members 124 that extend along the X direction. The channel members 124 extend between two source/drain features 130, each of which is disposed over a source/drain region 101SD. As described above, the source/drain features 130 may include silicon (Si) doped with an n-type dopant or silicon germanium (SiGe) doped with a p-type dopant. The channel members 124 may be referred to as nanostructures due to their nano-scale dimensions. In some instances, the channel members 124 may be referred to nanosheets when their width is greater than their thickness. In some other instances, the channel members 124 may be referred to as nanowires when their width is substantially similar to their thickness. A gate structure 126 is disposed over the channel region 101C to wrap around each of the channel members 124. As shown in the FIG. 2, the gate structure 126 is spaced apart from the source/drain features 130 by inner spacer features 140. The channel members 124 over the channel region 101C are vertically separated from one another by the inner spacer features 140.

A contact etch stop layer (CESL) 134 is disposed over the source/drain features 130 and an interlayer dielectric (ILD) layer 136 over the CESL 134. A source/drain contact 128 extends through the CESL 134 and the ILD layer 136 to come in contact with the source/drain feature 130. In some examples, the CESL 134 includes silicon nitride, silicon oxynitride, and/or other materials known in the art. The ILD layer 136 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The source/drain contacts 128 extend through the ILD layer 136 and the CESL 134 to electrically couple to the source/drain features 130 by way of a silicide layer 132. As shown in FIG. 2, the source/drain contact 128 has a contact width WD along the X direction and the gate structure 126 has a gate width WG along the X direction. In some instances, the contact width WD is between about 10 nm and about 20 nm and the gate width WG is between about 10 nm and about 20 nm. The inner spacer features 140 may include silicon nitride, silicon oxynitride, silicon carbonitride, or silicon oxycarbonitride.

Figure 3:
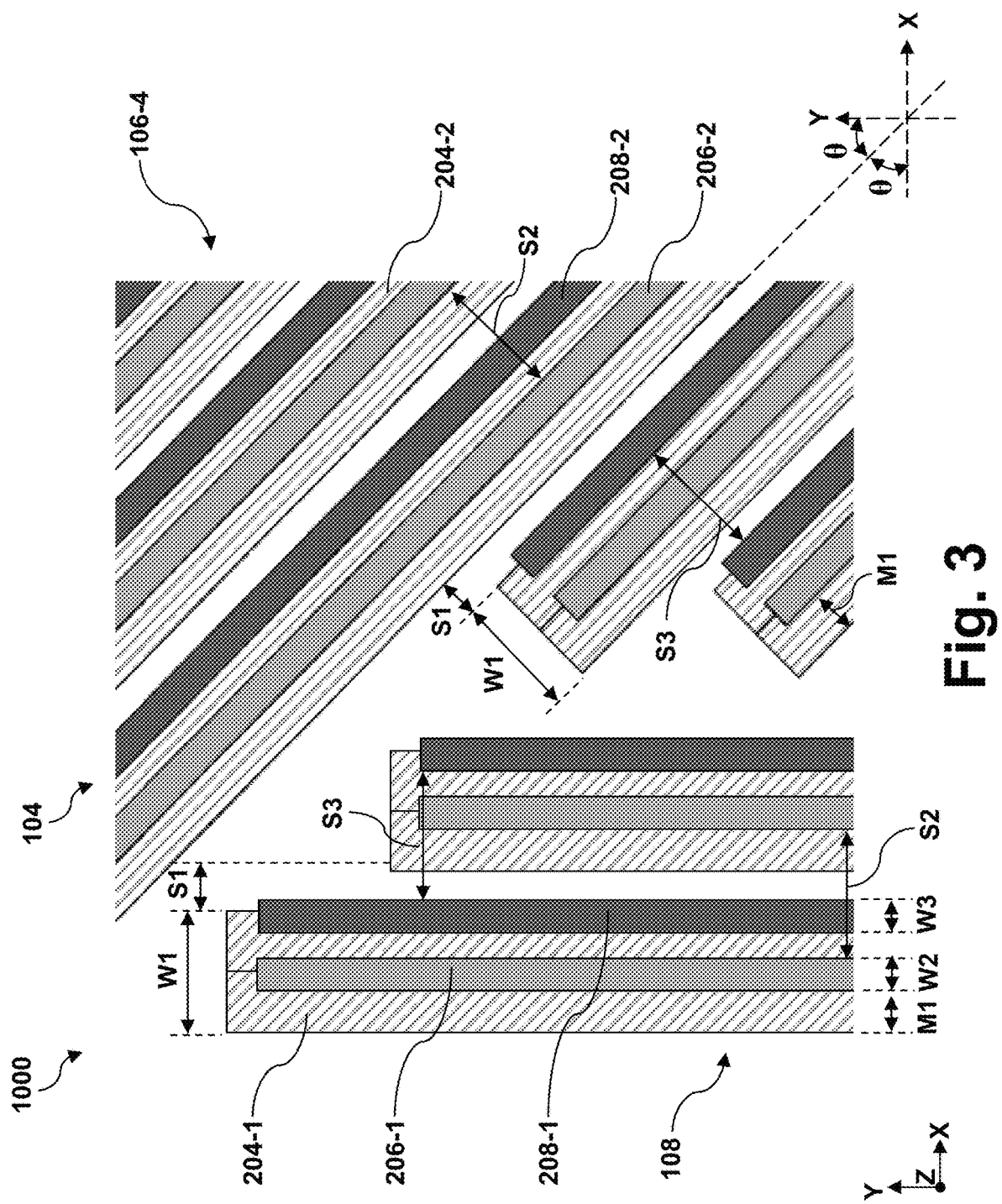
FIG. 3 illustrates an enlarged fragmentary top view of a first area 1000 of the IC chip in FIG. 1, according to one or more aspects of the present disclosure.
Figure 4:
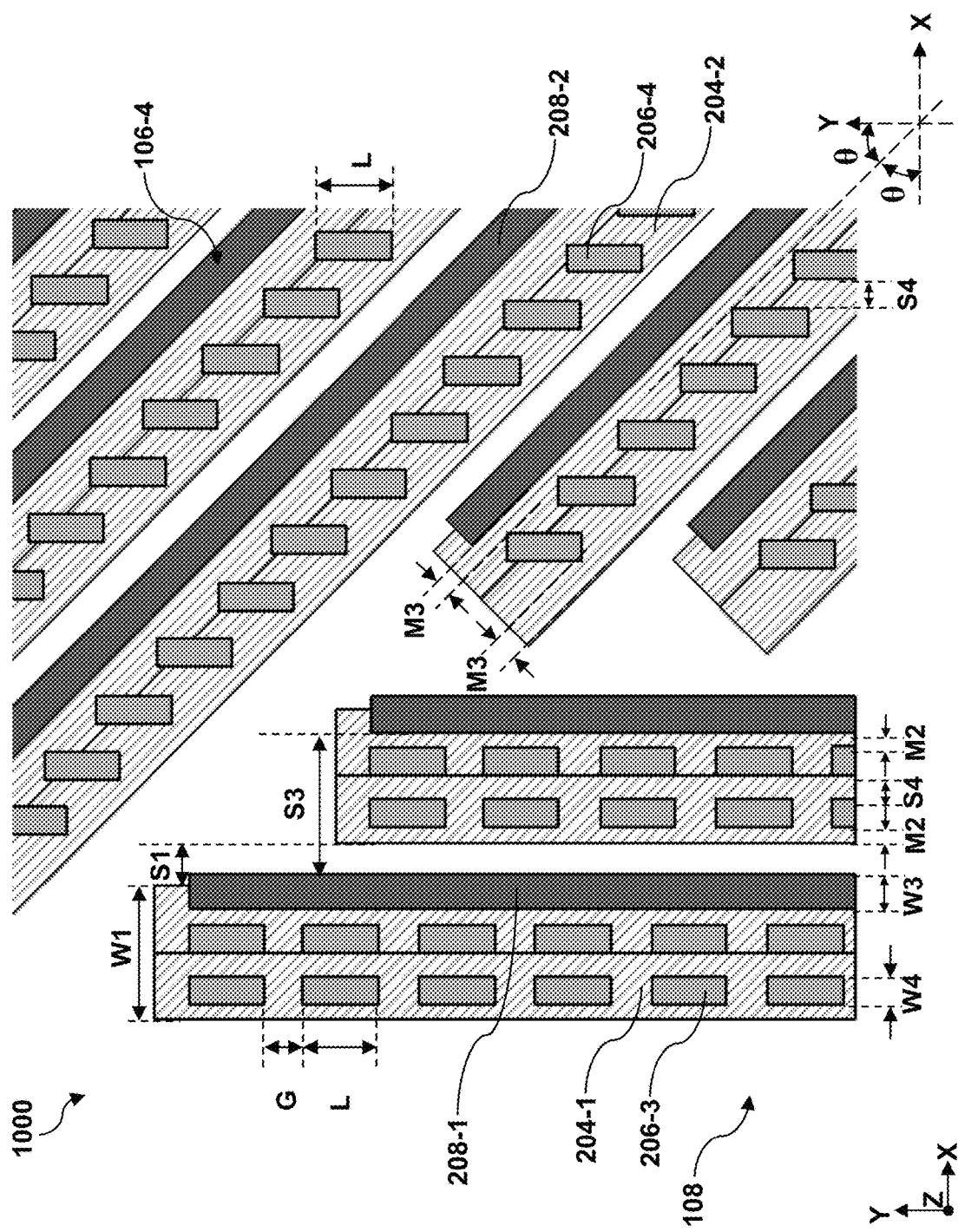
FIG. 4 illustrates an enlarged fragmentary top view of a first area 1000 of the IC chip in FIG. 1, according to one or more aspects of the present disclosure.
Figure 5:
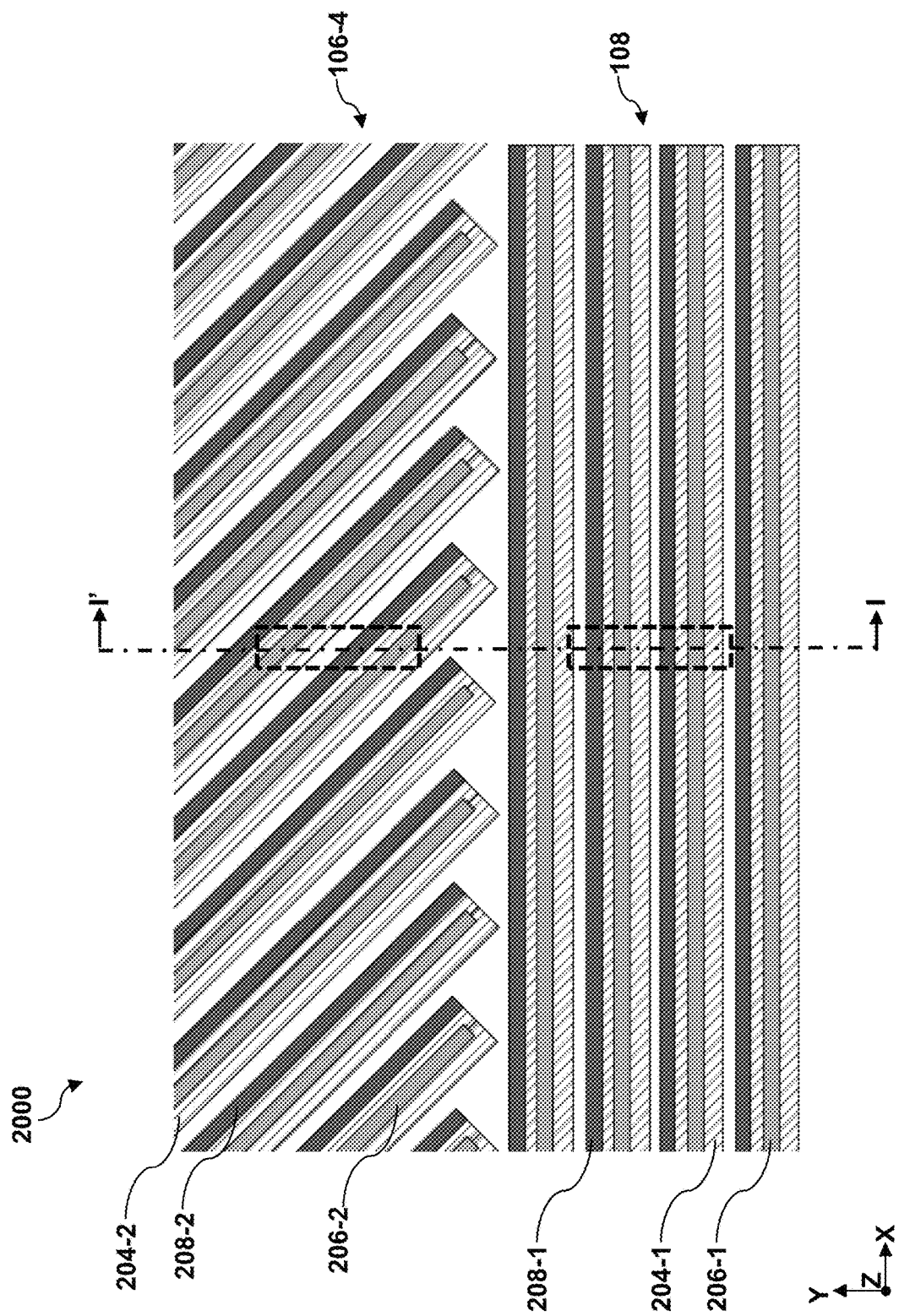
FIG. 5 illustrates an enlarged fragmentary top view of a second area 2000 of the IC chip in FIG. 1, according to one or more aspects of the present disclosure.
Figure 6:
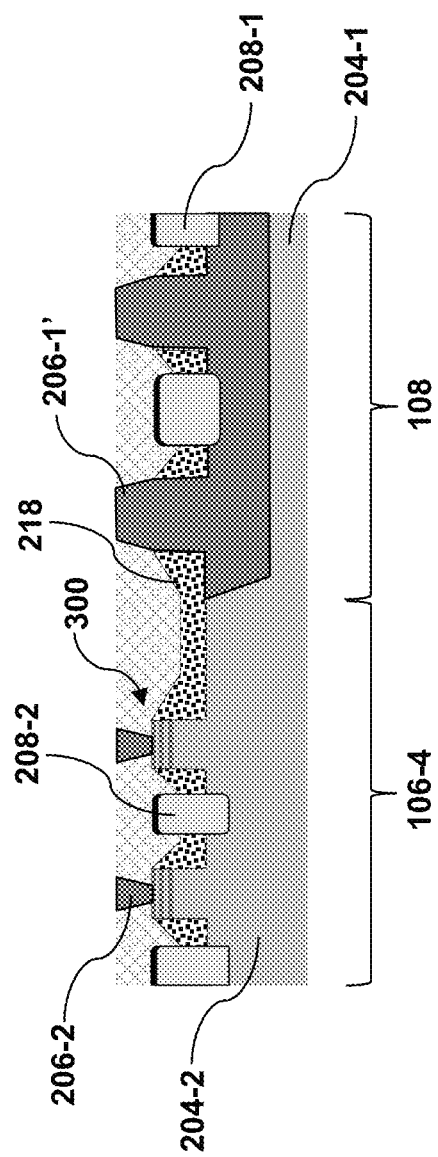
FIG. 6 illustrates a fragmentary cross-sectional view along line I-I' in FIG. 5, according to one or more aspects of the present disclosure.
Figure 7:
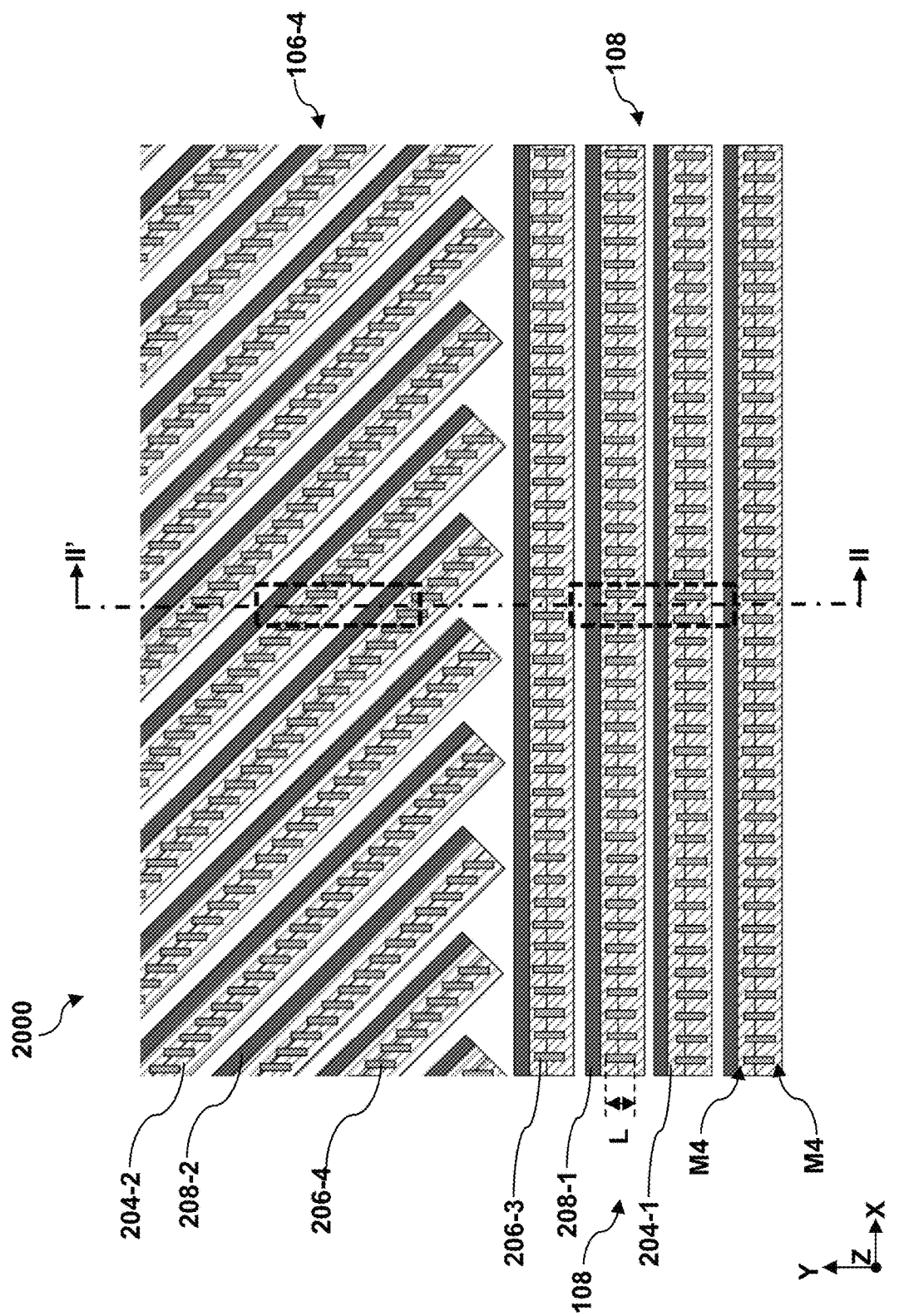
FIG. 7 illustrates an enlarged fragmentary top view of a second area 2000 of the IC chip in FIG. 1, according to one or more aspects of the present disclosure.
Figure 8:
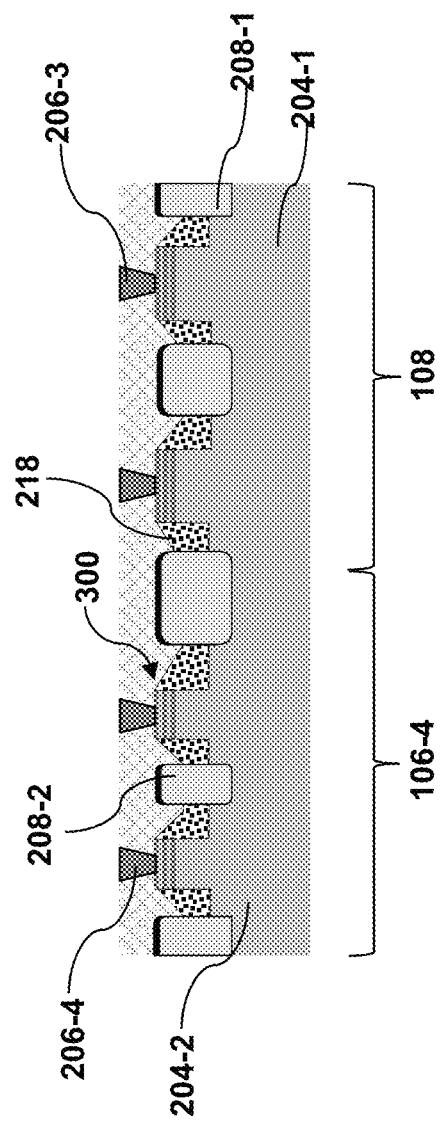
FIG. 8 illustrates a fragmentary cross-sectional view along line II-II' in FIG. 7, according to one or more aspects of the present disclosure.

Structures in the ring region 108 and the inner corner areas 106 will now be described in more details in conjunction with FIGS. 3-8. FIG. 3 illustrates an enlarged top view of a first area 1000 in FIG. 1, according to some embodiments of the present disclosure. FIG. 4 shows an enlarged top view of the first area 1000 in FIG. 1, according to some other embodiments of the present disclosure. FIG. 5 shows an enlarged top view of a second area 2000 in FIG. 1, according to some embodiments of the present disclosure. FIG. 6 includes a fragmentary cross-sectional view along line I-I' in FIG. 5, according to some embodiments of the present disclosure. FIG. 7 illustrates an enlarged top view of the second area 2000 in FIG. 1, according to some other embodiments of the present disclosure. FIG. 8 includes a fragmentary cross-sectional view along line II-II' in FIG. 7, according to some alternative embodiments of the present disclosure.

Reference is first made to FIG. 3. The first area 1000 includes a portion of the fourth inner corner area 106-4 and a portion of the ring region 108. As shown in FIG. 3, the ring region 108 includes first active regions 204-1 that have a first width W1 and are spaced apart from one another by a first spacing S1. Because the ring region 108 extends continuously around the device region 102, at least some of the first active regions 204-1 also extend continuously and completely around the device region 102. It is noted that the first active region 204-1 in FIG. 3 do not extend continuously around the device region 102 but are interrupted or cut short by the overlapping region 104 of the fourth inner corner area 106-4. In some embodiments, the first width W1 may be between about 250 nm and about 350 nm and the first spacing S1 may be between about 75 nm and about 125 nm. The first active regions 204-1 are disposed at a first pitch P1, which is a sum of the first width W1 and the first spacing S1. The first pitch P1, therefore, may be between about 325 nm and about 475 nm. The first active region 204-1 may include a plurality of first semiconductor layers interleaved by a plurality of second semiconductor layers. In some instances, the first semiconductor layers include silicon and the second semiconductor layers include silicon germanium. In the first area 1000, each of the first active regions 204-1 extends lengthwise along a first direction, which is the Y direction in FIG. 3.

A first gate structure 206-1 is disposed completely over the first active region 204-1 and extends lengthwise along the first direction, parallel to the first active region 204-1. In the depicted embodiments, the first gate structure 206-1 is disposed directly over a center line of the first active region 204-1. That is, each long side of the first gate structure 206-1 is spaced apart from a long side of the first active region 204-1 by a first margin M1. The first gate structure 206-1 may have a second width W2 along the X direction and may be spaced apart from an adjacent first gate structure 206-1 by a second spacing S2. In some instances, the first margin M1 may be between about 75 nm and about 125 nm, the second width W2 may be between about 75 nm and about 125 nm, and the second spacing S2 may be between about 250 nm and about 350 nm. The second width W2 in the ring region 108 is substantially larger than the gate width WG in the device region. A ratio of the second width W2 to the gate width WG may be between about 5 and 15. The first gate structures 206-1 are disposed at a second pitch P2, which is a sum of the second width W2 and the second spacing S1. The second pitch P2, therefore, may be between about 325 nm and about 475 nm. A single first source/drain contact 208-1 may be disposed partially over the first active region 204-1. As shown in FIG. 3, at least a portion of the first source/drain contact 208-1 overhangs the first active region 204-1 and is not disposed directly over the first active region 204-1. This arrangement is not trivial. The offsetting of the first source/drain contact 208-1 increases the spacing between the first gate structure 206-1 and the first source/drain contact 208-1 when the first gate structure 206-1 is disposed over the center line of the first active region 204-1. Each of the first source/drain contact 208-1 includes a third width W3 along the X direction and may be spaced apart from an adjacent first source/drain contact by the third spacing S3. In some instances, the third width W3 may be between about 75 nm and about 125 nm and the third spacing between about 250 nm and the 350 nm. A ratio of the third width W3 to the contact width WD may be between about 5 and 10. The first source/drain contacts 208-1 are disposed at a third pitch P3. The third pitch P3, therefore, may be between about 325 nm and about 475 nm. The first source/drain contacts 208-1 also extend lengthwise along the first direction, parallel to the first active region 204-1. When not interrupted by the overlapping region 104, the first active region 204-1, the first gate structure 206-1, and the first source/drain contact 208-1 in the ring region 108 are allowed to go completely around the device region 102 as a closed loop.

As shown in FIG. 3, the fourth inner corner area 106-4 includes second active regions 204-2, second gate structures 206-2, and the second source/drain contacts 208-2. The second active regions 204-2, the second gate structures 206-2, and the second source/drain contacts 208-2 extend lengthwise along a second direction that forms an acute angle θ with either the X direction or the Y direction. Because the first direction is along the Y direction, the second direction forms the same acute angle θ with the first direction. The acute angle θ may be between about 40° or about 50°. In the depicted embodiment, the acute angle θ is at 45°. In some embodiments, the second active regions 204-2, the second gate structures 206-2, and the second source/drain contacts 208-2 may have the same configurations with the first active regions 204-1, the first gate structures 206-1, and the first source/drain contacts 208-1. Each of the second active regions 204-2 has the first width W1 and are spaced apart from one another by the first spacing S1 along a direction perpendicular to the second direction. In some embodiments, the first width W1 may be between about 250 nm and about 350 nm and the first spacing S1 may be between about 75 nm and about 125 nm. The second active regions 204-2 are disposed at the first pitch P1, which is between about 325 nm and about 475 nm. The second active region 204-2 may include a plurality of first semiconductor layers interleaved by a plurality of second semiconductor layers. In some instances, the first semiconductor layers include silicon and the second semiconductor layers include silicon germanium. The second active region 204-2 extend continuously from one side of the fourth inner corner area 106-4 to another side of the fourth inner corner area 106-4.

Each of the second gate structures 206-2 is disposed completely over a second active region 204-2 and extends lengthwise along the second direction, parallel to the second active region 204-2. In the depicted embodiments, the second gate structure 206-2 is disposed directly over a center line of the second active region 204-2. That is, each long side of the second gate structure 206-2 is spaced apart from a long side of the second active region 204-2 by the first margin M1 along a direction perpendicular to the second direction. The first margin M1 may be between about 75 nm and about 125 nm. The second gate structure 206-2 may have the second width W2 along the direction perpendicular to the second direction and may be spaced apart from an adjacent second gate structure 206-2 by the second spacing S2. In some instances, the second width W2 may be between about 75 nm and about 125 nm, and the second spacing S2 may be between about 250 nm and about 350 nm. The second gate structures 206-2 are disposed at the second pitch P2, which is a sum of the second width W2 and the second spacing S1. The second pitch P2, therefore, may be between about 325 nm and about 475 nm.

A single second source/drain contact 208-2 may be disposed partially over the second active region 204-2. As shown in FIG. 3, at least a portion of the second source/drain contact 208-2 overhangs the second active region 204-2 and is not disposed directly over the second active region 204-2. This arrangement is not trivial. The offsetting of the second source/drain contact 208-2 increases the spacing between the second gate structure 206-2 and the second source/drain contact 208-2 when the second gate structure 206-2 is disposed over the center line of the second active region 204-2. Each of the second source/drain contact 208-2 includes the third width W3 along the X direction and may be spaced apart from an adjacent second source/drain contact 208-2 by the third spacing S3. In some instances, the third width W3 may be between about 75 nm and about 125 nm and the third spacing between about 250 nm and the 350 nm. The source source/drain contacts 208-2 are disposed at the third pitch P3, which is a sum of the third width W3 and the third spacing S3. The third pitch P3, therefore, may be between about 325 nm and about 475 nm.

The structures in FIG. 3 are generally satisfactory as part of the seal ring structures to protect the device region 102 from mist or stress. As shown in FIG. 3, the first gate structures 206-1 may be substantially coterminous with the first active regions 204-1 and the second gate structures 206-2 may be substantially coterminous with the second active regions 204-2. When a gate-last process or a gate replacement process is adopted, formation of the first gate structure 206-1 or the second gate structure 206-2 involves formation of dummy gate stacks of substantially the same length and subsequent replacement of the dummy gate stacks with functional gate structures such as the first gate structure 206-1 and the second gate structure 206-2. The dummy gate stacks may also be referred to as sacrificial gate stacks or sacrificial polysilicon (SACPO). Because the dummy gate stacks and the active regions are both formed of semiconductor materials such as polysilicon, silicon or silicon germanium, selective removal of the dummy gate stacks in the ring region 108 may become challenging. This is so because the dummy gate stacks in the ring region 108 or the inner corner areas 106 are about 5 to 15 times wider the dummy gate stacks in the device region 102. When the dummy gate stacks in the device region 102, the ring region 108, and the inner corner areas 106 are being removal simultaneously, the removal rate in the ring region 108 and the inner corner areas 106 is much faster than that in the device region 102. By the time the dummy gate stacks in the device region 102 is substantially removed and the etching is slowed down by the dummy dielectric layer, the dummy gate stacks in the ring region 108 and the inner corner areas 106 are long gone and the etching may progress to the underlying active regions. When the dummy gate stack removal process is not carefully controlled, a substantially thickness of the active regions in the ring region 108 and the inner corner areas 106 may be lost. This loss of active regions may cause an uneven surface and anomalies in the ring region 108 and the inner corner areas 106. In severe cases, the loss of active regions may reduce the height of the seal ring structure, leading to unsatisfactory protection for the device region 102.

To better prevent the aforementioned anomalies, different gate structures may be implemented in the ring region 108 and the inner corner areas 106. Reference is now made to FIG. 4, which illustrates an enlarged top view of the first area 1000. While FIG. 4 shows similar active regions and source/drain contacts, it illustrates alternative gate structure arrangements to guard against unintentional removal of the active regions. In the embodiments represented in FIG. 4, the ring region 108 includes first active regions 204-1 that have the first width W1 and are spaced apart from one another by the first spacing S1. Because the ring region 108 extends continuously around the device region 102, at least some of the first active regions 204-1 also extend continuously and completely around the device region 102. It is noted that the first active region 204-1 in FIG. 4 do not extend continuously around the device region 102 but are interrupted or cut short by the overlapping region 104 of the fourth inner corner area 106-4. In some embodiments, the first width W1 may be between about 250 nm and about 350 nm and the first spacing S1 may be between about 75 nm and about 125 nm. The first active regions 204-1 are disposed at the first pitch P1, which is a sum of the first width W1 and the first spacing S1. The first pitch P1, therefore, may be between about 325 nm and about 475 nm. The first active region 204-1 may include a plurality of first semiconductor layers interleaved by a plurality of second semiconductor layers. In some instances, the first semiconductor layers include silicon and the second semiconductor layers include silicon germanium. In the first area 1000, each of the first active regions 204-1 extends lengthwise along a first direction, which is the Y direction in FIG. 4.

A plurality of third gate structures 206-3 are disposed completely over the first active region 204-1. The plurality of third gate structures 206-3 over a first active region 204-1 may form more than one rows along the Y direction. In the depicted embodiments, the plurality of third gate structures 206 over the first active region 204-1 form two parallel rows that extend along the Y direction. The third gate structures 206-3 in each row are aligned along the Y direction and are spaced apart from one another by a gap G, which may be between about 40 nm and about 60 nm. Each of the plurality of third gate structures 206-3 has a length L and a fourth width W4. The length L may be between about 120 nm and about 160 nm and the fourth width W4 may be between about 18 nm and about 27 nm. Because the fourth width W4 is smaller than the second width W2, a ratio of the fourth width W4 to the gate width WG is much closer to unity. In some embodiments, the ratio of the fourth width W4 to the gate width WG may be between about 1 and about 2.5. Rows of the third gate structures 206-3 over the first active region 204-1 are spaced apart by a fourth spacing S4, which may be between about 60 nm and about 75 nm.

A single first source/drain contact 208-1 may be disposed partially over the first active region 204-1. As shown in FIG. 4, at least a portion of the first source/drain contact 208-1 overhangs the first active region 204-1 and is not disposed directly over the first active region 204-1. This arrangement is not trivial. The offsetting of the first source/drain contact 208-1 increases the spacing between the third gate structures 206-3 and the first source/drain contact 208-1. Each of the first source/drain contact 208-1 includes the third width W3 along the X direction and may be spaced apart from an adjacent first source/drain contact 208-1 by the third spacing S3. In some instances, the third width W3 may be between about 75 nm and about 125 nm and the third spacing S3 may be between about 250 nm and the 350 nm. The first source/drain contacts 208-1 are disposed at the third pitch P3, which is a sum of the third width W3 and the third spacing S3. The third pitch P3, therefore, may be between about 325 nm and about 475 nm. The first source/drain contacts 208-1 extend lengthwise along the first direction, parallel to the first active region 204-1. When not interrupted by the overlapping region 104, the first active region 204-1, the rows of third gate structures 206-3, and the first source/drain contact 208-1 in the ring region 108 are allowed to go completely around the device region 102 as a closed loop.

Reference is still made to FIG. 4. The fourth inner corner area 106-4 includes second active regions 204-2 that have the first width W1 and are spaced apart from one another by the first spacing S1. In some embodiments, the first width W1 may be between about 250 nm and about 350 nm and the first spacing S1 may be between about 75 nm and about 125 nm. The second active regions 204-2 are disposed at the first pitch P1, which is a sum of the first width W1 and the first spacing S1. The first pitch P1, therefore, may be between about 325 nm and about 475 nm. The second active region 204-2 may include a plurality of first semiconductor layers interleaved by a plurality of second semiconductor layers. In some instances, the first semiconductor layers include silicon and the second semiconductor layers include silicon germanium. In the first area 1000, each of the second active regions 204-2 extends lengthwise along the second direction, which forms an acute angle θ with either the X direction or the Y direction in FIG. 4. The acute angle θ may be between about 40° or about 50°. In the depicted embodiment, the acute angle θ is at 45°.

A plurality of fourth gate structures 206-4 are disposed completely over the second active region 204-2. The plurality of fourth gate structures 206-4 over a second active region 204-2, like the third gate structures 206-3, extend lengthwise along the first direction, which is parallel to the Y direction. This unification of gate lengthwise direction is not trivial. While theoretically gate structures of different orientations may be formed at the same time, the state-of-the-art lithographic techniques have limits and cannot ensure pattern uniformity and low edge roughness when gate structures have different orientations. Each of the fourth gate structures 206-4 has the length L and the fourth width W4. The length L may be between about 120 nm and about 160 nm and the fourth width W4 may be between about 18 nm and about 24 nm. The fourth gate structures 206-4 are spaced apart from one another and are arranged along the second direction, which forms the acute angle θ with either the X direction or the Y direction. Along the X direction, the fourth gate structures 206-4 are spaced apart by the fourth spacing S4. The fourth spacing S4 may be between about 60 nm and about 75 nm. Along a direction perpendicular to the second direction, the fourth gate structures 206-4 are spaced apart from a long side of the second active region 204-2 or the second source/drain contact 208-2 by a third margin M3. In some instances, the third margin M3 may be between about 60 nm and about 70 nm.

A single second source/drain contact 208-2 may be disposed partially over the second active region 204-2. As shown in FIG. 4, at least a portion of the second source/drain contact 208-2 overhangs the second active region 204-2 and is not disposed directly over the second active region 204-2. This arrangement is not trivial. The offsetting of the second source/drain contact 208-2 increases the spacing between the fourth gate structure 206-4 and the second source/drain contact 208-2. Each of the second source/drain contact 208-2 includes the third width W3 along the direction perpendicular to the second direction and may be spaced apart from an adjacent second source/drain contact 208-2 by the third spacing S3. In some instances, the third width W3 may be between about 75 nm and about 125 nm and the third spacing between about 250 nm and the 350 nm. The source source/drain contacts 208-2 are disposed at the third pitch P3, which is a sum of the third width W3 and the third spacing S3. The third pitch P3, therefore, may be between about 325 nm and about 475 nm.

As compared to the first gate structures 206-1 and the second gate structures 206-2 in FIG. 3, the third gate structures 206-3 and the fourth gate structures 206-4 are shorter and narrower. The first gate structures 206-1 and the second gate structures 206-2 have lengths greater than 3 μm (i.e., 3000 nm) while the third gate structures 206-3 and the fourth gate structures 206-4 have the length L, which may be between about 120 nm and about 160 nm. That is, the lengths of the first gate structures 206-1 and the second gate structures 206-2 are more than an order of magnitude greater than lengths of the third gate structures 206-3 or the fourth gate structures 206-4. The first gate structures 206-1 and the second gate structures 206-2 have the second width W2, which may be between about 75 nm and about 125 nm while the third gate structures 206-3 and the fourth gate structures 206-4 have the fourth width W4, which may be between about 18 nm and about 27 nm. That is, the second width W2 of the first gate structures 206-1 and the second gate structure 206-2 is about 3 times to about 7 times the fourth width W4 of the third gate structures 206-3 and the fourth gate structures 206-4. When a gate replacement process is adopted, the shorter and narrower third gate structures 206-3 and the fourth gate structures 206-4 are formed by replacement of shorter and narrower dummy gate stacks. Removal rates of the shorter and narrower dummy gate stacks in the ring region 108 are closer to the removal rates of the dummy gate stacks in the device region 102, which means a substantially smaller possibility to damage the active regions in the ring region 108. It can be seen how implementation of the embodiments in FIG. 4 may facilitate formation of a more uniform seal ring structures without anomalies. In the embodiments represented in FIG. 4, the fourth width W4 of the third gate structures 206-3 and the fourth gate structures 206-4 is smaller than the third width W3 of the first source/drain contacts 208-1 and the second source/drain contacts 208-2.

The disclosed ranges of the length L and the fourth width W4 of the third gate structures 206-3 and the fourth gate structures 206-4 are not trivial. It is observed that when the length L is smaller than 120 nm or the fourth width W4 is smaller than 18 nm, the third gate structures 206-3 and the fourth gate structures 206-4 may not provide sufficient mechanical strength called for the seal ring structures. When the length L is greater than 160 nm or when the fourth width is greater than 24 nm, it is more likely that the active regions underlying the third gate structures 206-3 and the fourth gate structures 206-4 may suffer unintentional loss during the formation of the gate structures. These ranges therefore provide a delicate balance between structural strength and loss of the active regions.

Reference is now made to FIG. 5, which illustrates an enlarged top view of the second area 2000 in FIG. 1 according to some embodiments. The second area 2000 includes a portion of the fourth inner corner area 106-4 and a portion of the ring region 108. The portion of the ring region 108 in FIG. 5 is an extension of the portion of the ring region 108 in FIG. 3. That is, FIG. 5 shows a snapshot of the same first active regions 204-1, first gate structures 206-1, and first source/drain contacts 208-1 in FIG. 3 that now extend downward along the Y direction and turn to extend along the X direction. In FIG. 5, the first active regions 204-1, the first gate structures 206-1 and the first source/drain contacts 208-1 extend along the X direction perpendicular to the Y direction. Although oriented differently, the widths, spacings, and pitches of the first active regions 204-1, the first gate structures 206-1 and the first source/drain contacts 208-1 remain unchanged. For example, the first active regions 204-1 in FIG. 5 have the first width W1, now measured along the Y direction; the first gate structures 206-1 in FIG. 5 have the second width W2, now measured along the Y direction; and the first source/drain contacts 208-1 in FIG. 5 have the third width W3, now measured along the Y direction. Detailed description of the first active regions 204-1, the first gate structures 206-1, and the first source/drain contacts 208-1 in FIG. 5 are omitted for brevity.

Similarly, the portion of the fourth inner corner area 106-4 in FIG. 5 is an extension of the portion of the fourth inner corner area 106-4 in FIG. 3. That is, FIG. 5 shows a snapshot of the same second active regions 204-2, second gate structures 206-2, and second source/drain contacts 208-2 in FIG. 3 that now extend further along the second direction, which forms the acute angle θ with either the X direction or the Y direction. In FIG. 5, the second active regions 204-2, the second gate structures 206-2 and the second source/drain contacts 208-2 extend along the second direction. It follows that the widths, spacings, and pitches of the second active regions 204-2, the second gate structures 206-2 and the second source/drain contacts 208-2 remain unchanged in FIG. 5. For example, the second active regions 204-2 in FIG. 5 have the first width W1 along the direction perpendicular to the second direction; the second gate structures 206-2 in FIG. 5 have the second width W2 along the direction perpendicular to the second direction; and the second source/drain contacts 208-2 in FIG. 5 have the third width W3 along the direction perpendicular to the second direction. Detailed description of the second active regions 204-2, the second gate structures 206-2, and the second source/drain contacts 208-2 in FIG. 5 are omitted for brevity.

Reference is made to FIG. 6, which illustrates a fragmentary cross-sectional view along line I-I' across the fourth inner corner area 106-4 and the ring region 108 in FIG. 5 along the Y direction. As shown in FIG. 6, when the first gate structures 206-1 are substantially coterminous with the first active regions 204-1, the removal of the dummy gate stacks in the ring region 108 may unintentionally remove a substantial thickness of the first active region 204-1 when the etching process is not carefully controlled. In some instances, the unintentionally removed first active region 204-1 may be as thickness as between about 450 nm and about 550 nm. As shown in FIG. 6, the over etching of the first active region 204-1 may result in a much larger alternative first gate structure 206-1' that may replace a portion of the first active region 204-1 that is unintentionally removed. In some instances, the unintentional removal of the first active region 204-1 may result in a local recess that may impact the integrity of the seal ring structure in the ring region 108. FIG. 6 also shows that the second active region 204-2 may include a stack 300 that includes a plurality of first semiconductor layers interleaved by a plurality of second semiconductor layers. In one embodiment, the first semiconductor layers include silicon and the second semiconductor layers include silicon germanium. Because the channel members 124 in the device region 102 are formed from structures similar the stack 300, the channel members 124 substantially correspond to the plurality of first semiconductor layers in the stack 300 in terms of composition and vertical positions. Due to the much greater dimensions, a source/drain feature 218 in the fourth inner corner area 106-4 or the ring region 108 may have a concave top profile.

Reference is then made to FIG. 7, which illustrates an enlarged top view of the second area 2000 in FIG. 1 according to some alternative embodiments. The second area 2000 includes a portion of the fourth inner corner area 106-4 and a portion of the ring region 108. The portion of the ring region 108 in FIG. 7 is an extension of the portion of the ring region 108 in FIG. 4. That is, FIG. 7 shows a snapshot of the same first active regions 204-1 and first source/drain contacts 208-1 in FIG. 4 that now extend downward along the Y direction and turn to extend along the X direction. The first active regions 204-1 and the first source/drain contacts 208-1 extend along the X direction perpendicular to the Y direction. Although oriented differently, the widths, spacings, and pitches of the first active regions 204-1 and the first source/drain contacts 208-1 remain unchanged. For example, the first active regions 204-1 in FIG. 7 have the first width W1, now measured along the Y direction; and the first source/drain contacts 208-1 in FIG. 7 have the third width W3, now measured along the Y direction. Detailed description of the first active regions 204-1 and the first source/drain contacts 208-1 in FIG. 7 are omitted for brevity.

The plurality of third gate structures 206-3 remain aligned with the Y direction but no longer form at least one row that extend along the Y direction, as is shown in FIG. 4. Instead, as shown in FIG. 7, along the edge of the ring region 108 that extends along the X direction, the plurality of third gate structures are spaced apart from one another and arranged along the X direction. Each of the plurality of third gate structures 206-3 in FIG. 7 has the length L and the fourth width W4. Each of the plurality of third gate structures 206-3 in FIG. 7 is spaced apart from the first source/drain contact 208-1 or a long side of the first active region 204-1 by a fourth margin M4, which may be between about 40 nm and about 60 nm in some instances. In some embodiments, the fourth margin M4 and the gap G are the same to provide a similar environment for formation of the third gate structures 206-3. It is observed that the similar environment, which includes distance apart from nearby structures, is key to a robust and reproducible formation process of the gate structures.

The portion of the fourth inner corner area 106-4 in FIG. 7 is an extension of the portion of the fourth inner corner area 106-4 in FIG. 4. That is, FIG. 7 shows a snapshot of the same second active regions 204-2, fourth gate structures 206-4, and second source/drain contacts 208-2 in FIG. 4 that now extend further along the second direction, which forms the acute angle θ with either the X direction or the Y direction. In FIG. 7, the second active regions 204-2, the fourth gate structures 206-4 and the second source/drain contacts 208-2 extend or are arranged along the second direction. It follows that the widths, spacings, and pitches of the second active regions 204-2, the fourth gate structures 206-4 and the second source/drain contacts 208-2 remain unchanged in FIG. 7. For example, the second active regions 204-2 in FIG. 7 have the first width W1 along the direction perpendicular to the second direction; the fourth gate structures 206-4 in FIG. 7 have the second width W2 along the direction perpendicular to the second direction; and the second source/drain contacts 208-2 in FIG. 7 have the third width W3 along the direction perpendicular to the second direction. Detailed description of the second active regions 204-2, the fourth gate structures 206-4, and the second source/drain contacts 208-2 in FIG. 7 are omitted for brevity.

Reference is finally made to FIG. 8, which illustrates a fragmentary cross-sectional view along line II-II' across the fourth inner corner area 106-4 and the ring region 108 in FIG. 7 along the Y direction. As shown in FIG. 8, when the third gate structures 206-3 and the fourth gate structures 206-4 are made shorter and narrower as described above, the removal of the dummy gate stacks in the ring region 108 and the fourth inner corner area 106-4 is much less likely to damage the underlying first active region 204-1 or second active region 204-2. This allows the ring region 108 to have a more planar profile and a more uniform construction. FIG. 8 also shows that the first active region 204-1 and the second active region 204-2 may include a stack 300 that includes a plurality of first semiconductor layers interleaved by a plurality of second semiconductor layers. In one embodiment, the first semiconductor layers include silicon and the second semiconductor layers include silicon germanium. Due to the much greater dimensions, a source/drain feature 218 in the fourth inner corner area 106-4 or the ring region 108 may have a concave top profile.

In one exemplary aspect, the present disclosure is directed to an integrated circuit (IC) chip. The IC chip includes a device region, a ring region surrounding the device region, and a corner area between an outer corner of the device region and an inner corner of the ring region. The ring region includes a first active region extending along a first direction, a first source/drain contact disposed partially over the first active region and extending along the first direction, and a plurality of first gate structures disposed completely over the first active region and each extending lengthwise along the first direction. The corner area includes a second active region extending along a second direction that forms an acute angle with the first direction, a second source/drain contact disposed partially over the second active region and extending along the second direction, and a plurality of second gate structures disposed over the second active region and each extending along the first direction.

In some embodiments, the acute angle is 45°. In some implementations, the plurality of first gate structures are arranged to form at least one row of first gate structures and first gate structures in one of the at least one row of first gate structures are spaced apart from one another by a gap along the first direction. In some instances, the at least one row of first gate structures includes two rows of first gate structures. In some embodiments, the plurality of second gate structures are arranged to along the second direction and the plurality of second gate structures are spaced apart from one another. In some instances, each of the plurality of first gate structures includes a length along the first direction and each of the plurality of second gate structures includes the length along the first direction. In some embodiments, the length is between about 120 nm and about 180 nm. In some implementations, each of the plurality of first gate structures includes a width along a third direction perpendicular to the first direction and each of the plurality of second gate structures includes the width along the third direction. In some embodiments, the width is between about 20 nm and about 30 nm.

In another exemplary aspect, the present disclosure is directed to an IC chip. The IC chip includes a device region and a ring region surrounding the device region. The ring region includes a first active region extending along a first direction, a first source/drain contact disposed partially over the first active region and extending along the first direction, and a plurality of first gate structures disposed completely over the first active region and each extending lengthwise along the first direction. The first active region includes a first plurality of channel layers interleaved by a first plurality of sacrificial layers.

In some embodiments, the first plurality of channel layers include silicon and the first plurality of sacrificial layers include silicon germanium. In some implementations, the plurality of first gate structures do not extend between the first plurality of channel layers. In some implementations, the IC chip further includes a corner area between an outer corner of the device region and an inner corner of the ring region. The corner area includes a second active region extending along a second direction that forms an acute angle with the first direction, a second source/drain contact disposed partially over the second active region and extending along the second direction, and a plurality of second gate structures disposed over the second active region and each extending along the first direction. In some implementations, the second active region includes a second plurality of channel layers interleaved by a second plurality of sacrificial layers. In some instances, the plurality of second gate structures do not extend between the second plurality of channel layers.

In yet another exemplary aspect, the present disclosure is directed to an IC chip. The IC chip includes a device region, a ring region surrounding the device region, and a corner area between an outer corner of the device region and an inner corner of the ring region. The ring region includes a plurality of first active regions extending continuously around the ring region, a plurality of second active regions extending along a first direction and a plurality of first gate structures disposed completely over each of the plurality of second active regions and each extending lengthwise along the first direction. The corner area includes a plurality of third active regions extending along a second direction that forms an acute angle with the first direction, and a plurality of second gate structures completely disposed over each of the plurality of third active region and each extending along the first direction.

In some embodiments, the acute angle is 45°. In some implementations, the ring region further includes a plurality of third gate structures disposed completely over each of the plurality of first active regions. In some instances, the plurality of third gate structures are spaced apart from one another and are arranged to surround the device region. In some instances, the plurality of second gate structures are arranged to along the second direction and the plurality of second gate structures are spaced apart from one another.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) chip, comprising:
a device region;
a ring region surrounding the device region, wherein the ring region comprises:
a first active region extending along a first direction,
a first source/drain contact disposed partially over the first active region and extending along the first direction, and
a plurality of first gate structures disposed completely over the first active region and each extending lengthwise along the first direction; and
a corner area between an outer corner of the device region and an inner corner of the ring region, wherein the corner area comprises:
a second active region extending along a second direction that forms an acute angle with the first direction,
a second source/drain contact disposed partially over the second active region and extending along the second direction, and
a plurality of second gate structures disposed over the second active region and each extending along the first direction.

2. The IC chip of claim 1, wherein the acute angle is 45°.

3. The IC chip of claim 1,
wherein the plurality of first gate structures are arranged to form at least one row of first gate structures,
wherein first gate structures in one of the at least one row of first gate structures are spaced apart from one another by a gap along the first direction.

4. The IC chip of claim 3, wherein the at least one row of first gate structures comprises two rows of first gate structures.

5. The IC chip of claim 1,
wherein the plurality of second gate structures are arranged to along the second direction,
wherein the plurality of second gate structures are spaced apart from one another.

6. The IC chip of claim 1,
wherein each of the plurality of first gate structures comprises a length along the first direction,
wherein each of the plurality of second gate structures comprises the length along the first direction.

7. The IC chip of claim 6, wherein the length is between about 120 nm and about 180 nm.

8. The IC chip of claim 1,
wherein each of the plurality of first gate structures comprises a width along a third direction perpendicular to the first direction,
wherein each of the plurality of second gate structures comprises the width along the third direction.

9. The IC chip of claim 8, wherein the width is between about 20 nm and about 30 nm.

10. An integrated circuit (IC) chip, comprising:
a device region; and
a ring region surrounding the device region, wherein the ring region comprises:
a first active region extending continuously and lengthwise along a first direction,
a first source/drain contact disposed partially over the first active region and extending along the first direction, and
a plurality of first gate structures disposed completely over the first active region such that the plurality of first gate structures does not extend beyond the first active region,
wherein the first source/drain contact extends continuously alongside the plurality of first gate structures,
wherein the first active region comprises a first plurality of channel layers interleaved by a first plurality of sacrificial layers,
wherein the plurality of first gate structures extends lengthwise along the first direction.

11. The IC chip of claim 10,
wherein the first plurality of channel layers comprise silicon,
wherein the first plurality of sacrificial layers comprise silicon germanium.

12. The IC chip of claim 10, wherein the plurality of first gate structures do not extend between the first plurality of channel layers.

13. The IC chip of claim 10, further comprising:
a corner area between an outer corner of the device region and an inner corner of the ring region, wherein the corner area comprises:
a second active region extending along a second direction that forms an acute angle with the first direction,
a second source/drain contact disposed partially over the second active region and extending along the second direction, and
a plurality of second gate structures disposed over the second active region and each extending along the first direction.

14. The IC chip of claim 13, wherein the second active region comprises a second plurality of channel layers interleaved by a second plurality of sacrificial layers.

15. The IC chip of claim 14, wherein the plurality of second gate structures do not extend between the second plurality of channel layers.

16. An integrated circuit (IC) chip, comprising:
a device region;
a ring region surrounding the device region, wherein the ring region comprises:
a plurality of first active regions extending continuously around the ring region,
a plurality of second active regions extending along a first direction, and
a plurality of first gate structures disposed completely over each of the plurality of second active regions and each extending lengthwise along the first direction; and
a corner area between an outer corner of the device region and an inner corner of the ring region, wherein the corner area comprises:
a plurality of third active regions extending along a second direction that forms an acute angle with the first direction, and
a plurality of second gate structures completely disposed over each of the plurality of third active region and each extending along the first direction.

17. The IC chip of claim 16, wherein the acute angle is 45°.

18. The IC chip of claim 16, wherein the ring region further comprises:
a plurality of third gate structures disposed completely over each of the plurality of first active regions.

19. The IC chip of claim 18, wherein the plurality of third gate structures are spaced apart from one another and are arranged to surround the device region.

20. The IC chip of claim 16,
wherein the plurality of second gate structures are arranged to along the second direction,
wherein the plurality of second gate structures are spaced apart from one another.

\* \* \* \* \*